(12) United States Patent
Ding et al.

(10) Patent No.: US 11,848,688 B2
(45) Date of Patent: Dec. 19, 2023

(54) DECODING METHOD AND DEVICE, APPARATUS, AND STORAGE MEDIUM

(71) Applicant: SANECHIPS TECHNOLOGY CO., LTD., Shenzhen (CN)

(72) Inventors: Jialong Ding, Shenzhen (CN); Guangming Shi, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/778,932

(22) PCT Filed: Sep. 22, 2020

(86) PCT No.: PCT/CN2020/116891
§ 371 (c)(1),
(2) Date: May 23, 2022

(87) PCT Pub. No.: WO2021/109683
PCT Pub. Date: Jun. 10, 2021

(65) Prior Publication Data
US 2023/0006695 A1    Jan. 5, 2023

(30) Foreign Application Priority Data
Dec. 2, 2019 (CN) .......................... 201911212695.9

(51) Int. Cl.
*H03M 13/00* (2006.01)
*H03M 13/11* (2006.01)
(Continued)

(52) U.S. Cl.
CPC ... *H03M 13/6561* (2013.01); *H03M 13/1128* (2013.01); *H03M 13/1134* (2013.01); *H03M 13/13* (2013.01); *H03M 13/458* (2013.01)

(58) Field of Classification Search
CPC ......... H03M 13/1134; H03M 13/1128; H03M 13/458; H03M 13/6561; H03M 13/13; H03M 13/15
See application file for complete search history.

(56) References Cited

U.S. PATENT DOCUMENTS

| | | | |
|---|---|---|---|
| 2006/0161830 A1* | 7/2006 | Yedidia ............. | H03M 13/6561 714/758 |
| 2014/0208183 A1* | 7/2014 | Mahdavifar .......... | H03M 13/27 714/755 |

(Continued)

FOREIGN PATENT DOCUMENTS

| | | |
|---|---|---|
| CN | 106712778 A | 5/2017 |
| CN | 109428607 A | 3/2019 |

(Continued)

OTHER PUBLICATIONS

J. Yin, Q. Huang, L. Li, A. Gao, W. Chen and Z. Han, "High throughput parallel encoding and decoding architecture for polar codes," 2017 IEEE/CIC International Conference on Communications in China (ICCC), Qingdao, China, 2017, pp. 1-5.*

(Continued)

*Primary Examiner* — Steve N Nguyen
(74) *Attorney, Agent, or Firm* — CANTOR COLBURN LLP

(57) ABSTRACT

A decoding method and device are provided. The method includes: decoding grouped original data in parallel by a first decoding unit to obtain grouped decoded data; decoding merged grouped decoded data by a second decoding unit to obtain decoded data; and if the sum of the lengths of the decoded data is an integer multiple of an upper limit of the decoding times of the second decoding unit, updating the first decoding unit and the second decoding unit, and if the sum of the lengths of the decoded data is not an integer multiple of the upper limit of the decoding times of the (Continued)

second decoding unit, updating the second decoding unit to obtain the decoded data again, until the sum of the lengths of the decoded data is equal to a decoding length, and merging the decoded data to serve as a decoding result of the original data.

19 Claims, 5 Drawing Sheets

(51) Int. Cl.
*H03M 13/45* (2006.01)
*H03M 13/13* (2006.01)

(56) References Cited

U.S. PATENT DOCUMENTS

| | | | | |
|---|---|---|---|---|
| 2015/0288387 | A1* | 10/2015 | Jiao | H03M 13/3746 714/764 |
| 2015/0381208 | A1* | 12/2015 | Li | H03M 13/616 714/755 |
| 2016/0142074 | A1* | 5/2016 | Sham | H03M 13/116 714/776 |
| 2018/0019766 | A1 | 1/2018 | Yang | |
| 2019/0245650 | A1* | 8/2019 | Hui | H03M 13/2933 |
| 2019/0312676 | A1 | 10/2019 | Jeong | |
| 2020/0201708 | A1* | 6/2020 | Hanham | H03M 13/2906 |
| 2020/0321982 | A1* | 10/2020 | Kamiya | H03M 13/6516 |

FOREIGN PATENT DOCUMENTS

| | | |
|---|---|---|
| CN | 109428608 A | 3/2019 |
| CN | 109995382 A | 7/2019 |

OTHER PUBLICATIONS

S. Xing, Y.-N. Chang and L. Chen, "A four-bank memory design of optimized semi-parallel polar decoder," 2017 IEEE 9th International Conference on Communication Software and Networks (ICCSN), Guangzhou, China, 2017, pp. 80-84.*
Bin Li, "Parallel Decoders of Polar Codes" Sep. 4, 2013, pp. 1-4, XP055239917.
Camille Leroux, "A Semi-Parallel Successive-Cancellation Decoder for Polar Codes", IEEE Transactions on Signal Processing, vol. 61, No. 2., Jan. 15, 2013, XP011482640.
Camille Leroux, "Hardware architectures for successive cancellation decoding of polar codes" IEEE International Conferemce on Acoustics, May 22, 2022, pp. 1665-1668, XP032001150.
Dongyun Kam, "Ultra-Low-Latency Parallel SC Polar Decoding Architechture for 5G Wireless Communications", IEE International Symposium on Circuits and Systems (ISCAS), May 26, 2019, pp. 1-5 XP033574485.
European Search Report for corresponding application EP20895759; dated Jan. 3, 2023.
Guillaume Berhault, "Memory Requirement Reduction Method for Successive Cancellation Decoding of Polar Codes", J Sign Process Syst (2017) 88: 425-438, XP036280758.
International Search Report for corresponding application PCT/CN2020/116891 filed Sep. 22, 2020; dated Dec. 21, 2020.

* cited by examiner

DECODING METHOD AND DEVICE, APPARATUS, AND STORAGE MEDIUM

CROSS-REFERENCE TO RELATED APPLICATION

The present disclosure claims priority to Chinese patent application No. CN201911212695.9, filed on Dec. 2, 2019, and entitled "decoding method and device, apparatus, and storage medium", the disclosure of which is hereby incorporated by reference in its entirety.

TECHNICAL FIELD

The present disclosure relates to the technical field of wireless communications, and in particular to a decoding method and device, an apparatus, and a storage medium.

BACKGROUND

For polar codes (Polar Codes, Polar codes) used in 5th generation mobile networks (5th generation mobile networks, 5G), common decoding algorithms are a successive cancellation (Successive Cancellation, SC) decoding algorithm, and a plurality of improved algorithms based on the SC decoding algorithm. If N0 points need to be calculated in a complete decoding process, the common decoding algorithm calculates decoding results of n points every time, and performs iteration on the basis of the decoding results of the n points the next time. Since there are many cases where the length of the 5G Polar code to be decoded is NO, when the decoding length is relatively long, the decoding time delay and occupied resources are obviously increased by using the common decoding algorithm.

SUMMARY

Embodiments of the present disclosure provide a decoding method and device, a system, and a storage medium. The reconstruction of decoding resources is realized by performing grouped decoding on original data.

An embodiment of the present disclosure provides a decoding method, including: decoding grouped original data in parallel by a first decoding unit to obtain grouped decoded data; decoding merged grouped decoded data by a second decoding unit to obtain decoded data; if the sum of the lengths of the decoded data is an integer multiple of an upper limit of the decoding times of the second decoding unit, updating the first decoding unit and the second decoding unit, and if the sum of the lengths of the decoded data is not an integer multiple of the upper limit of the decoding times of the second decoding unit, updating the second decoding unit to obtain the decoded data again, until the sum of the lengths of the decoded data is equal to a decoding length, and merging the decoded data to serve as a decoding result of the original data.

An embodiment of the present disclosure provides a decoding device, including: a first decoding module, configured to decode grouped original data in parallel by a first decoding unit to obtain grouped decoded data; a second decoding module, configured to decode merged grouped decoded data by a second decoding unit to obtain decoded data; a circulation module configured to, if the sum of the lengths of the decoded data is an integer multiple of an upper limit of the decoding times of the second decoding unit, update the first decoding unit and the second decoding unit, if the sum of the lengths of the decoded data is not an integer multiple of the upper limit of the decoding times of the second decoding unit, update the second decoding unit to obtain the decoded data again, until the sum of the lengths of the decoded data is equal to a decoding length, and merge the decoded data to serve as a decoding result of the original data.

An embodiment of the present disclosure provides an apparatus, including: one or more processors; and a storage device, configured to store one or more programs, wherein when the one or more programs are executed by the one or more processors, the one or more processors implement the decoding method in the embodiment of the present disclosure.

An embodiment of the present disclosure provides a storage medium, wherein a computer program is stored in the storage medium, and when executed by a processor, the computer program implements the decoding method in the embodiment of the present disclosure.

According to the decoding method and device, the apparatus, and the storage medium provided by the embodiments of the present disclosure, by means of grouping the original data, decoding the grouped original data in parallel by the first decoding unit to obtain the grouped decoded data, then decoding the merged grouped decoded data by the second decoding unit to obtain the decoded data, before the sum of the lengths of the decoded data is equal to the decoding length, repeatedly updating the first decoding unit and the second decoding unit, or updating the second decoding unit to obtain new decoded data, and finally obtaining the decoding result of the original data, the reconstruction of decoding resources is realized while maintaining the time delay basically unchanged.

DETAILED DESCRIPTION OF THE EMBODIMENTS

In order to make the objectives, technical solutions and advantages of the present disclosure clearer, the embodiments of the present disclosure will be described in detail below in combination with the drawings. It should be noted that, the embodiments in the present disclosure and features in the embodiments can be arbitrarily combined with each other under the condition of no conflict.

Figure 1:
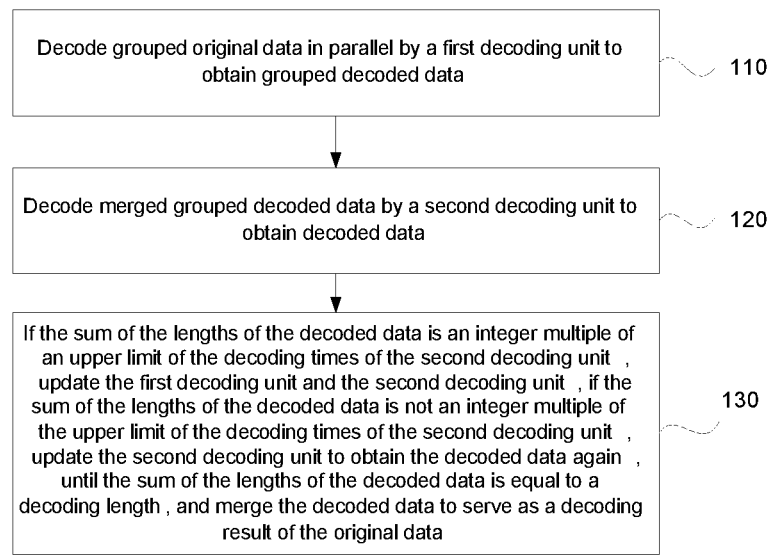
FIG. 1 is a schematic flow diagram of a decoding method according to an embodiment of the present disclosure.

FIG. 1 is a schematic flow diagram of a decoding method according to an embodiment of the present disclosure, and the method can be applied to the case of decoding polar code data. The method can be executed by a decoding device provided by the embodiment of the present disclosure, wherein the device is implemented by software and/or hardware, and is integrated in an apparatus that provides a decoding service. As shown in FIG. 1, the method includes:

Step 110: decoding grouped original data in parallel by a first decoding unit to obtain grouped decoded data.

The original data are polar code data to be decoded, the first decoding unit is used for decoding the original data, the number of the first decoding units is determined by the number of data included in the original data, when there are a plurality of first decoding units, it is necessary to averagely group the original data to obtain grouped original data corresponding to the first decoding units, and by inputting the grouped original data into the corresponding first decoding units in parallel, the grouped decoded data output by the first decoding units can be obtained.

In an example, before decoding the grouped original data in parallel by the first decoding unit to obtain the grouped decoded data, the method can further include: acquiring a decoding length corresponding to the original data; and determining, according to a preset decoding resource allocation table, a first decoding unit and a second decoding unit corresponding to the decoding length.

It should be noted that, since the number of data included in the original data is different, decoding resources required to complete a complete decoding process are also different. Therefore, before decoding is performed, it is necessary to acquire the decoding length corresponding to the original data at first, that is, the number of data included in the original data, and then the preset decoding resource allocation table is queried according to the decoding length, so as to determine which first decoding units and second decoding units are required to complete the decoding of the original data, wherein the preset decoding resource allocation table includes first decoding units and second decoding units corresponding to various decoding length respectively.

In a specific implementation, if the decoding length of the original data is 1024, then by querying the preset decoding resource allocation table, it can be seen that when the decoding length is 1024, the first decoding unit includes the first to the $32^{nd}$ minimum decoding code units, the second decoding unit includes the $33^{rd}$ minimum decoding code unit, wherein each minimum decoding unit can independently complete the decoding process of a code length of 32.

In an example, before decoding the grouped original data in parallel by the first decoding unit to obtain the grouped decoded data, the method can further include: determining, according to the decoding length, a second number corresponding to each first decoding unit; and for each first decoding unit, sequentially extracting a second number of original data to be decoded from the original data after every third number of original data to be decoded, and merging the extracted data to be decoded in sequence to serve as the grouped original data corresponding to the first decoding unit.

The third number can be set to 32, and the second number is equal to the third number/the number of the first decoding units.

In a specific implementation, since there is a plurality of first decoding units corresponding to the original data, in order to decode the original decoded data by the plurality of first decoding units, it is necessary to group the original data. For example, the original data with the decoding length 1024 include 32 corresponding first decoding units, so the original decoded data need to be divided into 32 groups on average. Specifically, the original data can be divided into a plurality of original data blocks, and each original data block includes 32 pieces of data, for example, the original data blocks divided from the original data with the decoding length 1024 includes i0-i31, i32-i63 . . . i992-i1023, one piece of data to be decoded is extracted from each original data block in sequence and is merged according to an extraction sequence to obtain a group of data, for example, i0, i32, i64 . . . i992, and the above process is repeated for 32 times to divide the original data into 32 groups.

Step 120: decoding merged grouped decoded data by the second decoding unit to obtain decoded data.

It should be noted that, the grouped decoded data output by the first decoding unit are the input data of the second decoding unit, after the grouped decoded data output by each first decoding unit are merged in sequence, the merged grouped decoded data are input into the second decoding unit for decoding to obtain a piece of decoded data.

In an example, after obtaining the decoded data, the method can further include: storing the decoded data in a register group.

It should be noted that, the decoded data currently stored in a register can be used for calculating new decoded data, so as to obtain a decoding result of the original data.

In an example, after storing the decoded data in the register group, the method can further include: if the sum of the lengths of the decoded data stored in the register group conforms to a preset calculation sub-unit switching rule, switching calculation sub-units in the first decoding unit or the second decoding unit.

It should be noted that, both the first decoding unit and the second decoding unit include a plurality of calculation sub-units, for example, a first calculation sub-unit, a second calculation sub-unit, a fourth calculation sub-unit, an eighth calculation sub-unit and a sixteenth calculation sub-unit, but all calculation sub-units in the second decoding unit are used, and a part of the calculation sub-units in the first decoding unit may be used according to the decoding length. For example, when the decoding length is 512, the second, the fourth, the eighth and the sixteenth calculation sub-units in the first decoding unit can all be used, and the first calculation sub-unit is not used.

It should be noted that, the switching of the calculation sub-units essentially refers to switching the input data of the calculation sub-units, and after the calculation sub-units in the first decoding unit or the second decoding unit are switched according to the preset calculation sub-unit switching rule, new decoded data can be calculated.

In an example, the preset calculation sub-unit switching rule includes: switching the Mtn calculation sub-unit in the first decoding unit, when the sum of the lengths of the decoded data is an integer multiple of the number *2*M of the first decoding units; and switching the Nth calculation sub-unit in the second decoding unit, when the sum of the length of the decoded data is an integer multiple of 2*N, wherein the $M^{th}$ calculation sub-unit includes M basic calculators, and the Nth calculation sub-unit includes N basic calculators.

In a specific implementation, if the decoding length is 512, the first, the second, the fourth, the eighth and the sixteenth calculation sub-units in the second decoding unit are respectively switched when the sum of the lengths of the decoded data stored in the register group is equal to an integer multiple of 2, 4, 8, 16 and 32. The second, the fourth and the eighth calculation sub-units in the first decoding unit are respectively switched when the sum of the lengths of the decoded data stored in the register group is equal to an integer multiple of 64, 128 and 256, wherein the sixteenth calculation sub-unit in the first decoding unit does not need to be switched, and the first calculation sub-unit is not used.

Figure 2:
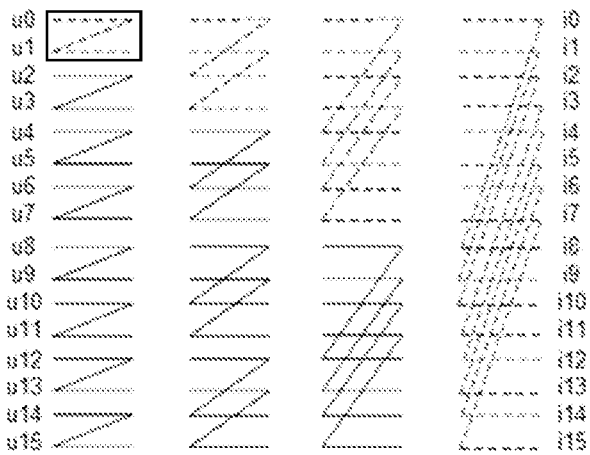
FIG. 2 is a schematic diagram of a decoding calculation process according to an embodiment of the disclosure.
Figure 3:
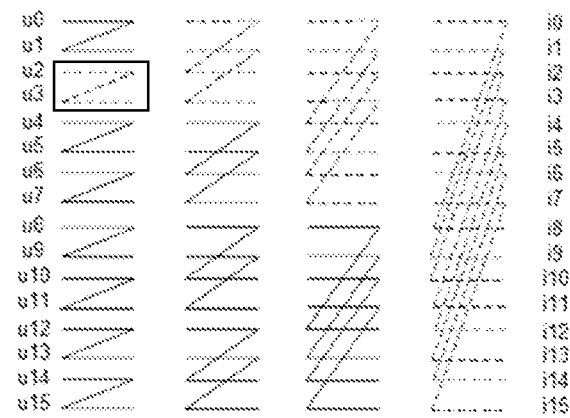
FIG. 3 is a schematic diagram of a decoding calculation process according to an embodiment of the disclosure.
Figure 4:
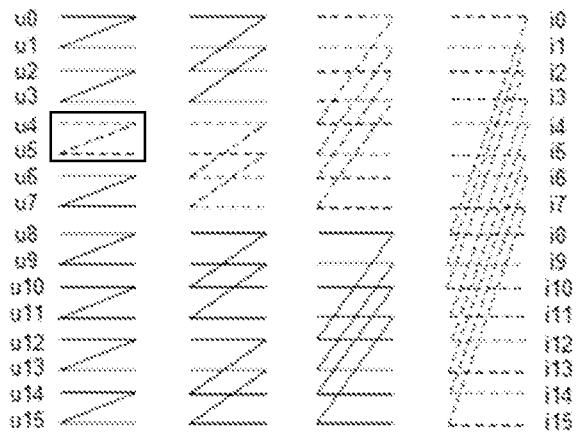
FIG. 4 is a schematic diagram of a decoding calculation process according to an embodiment of the present disclosure.

Exemplarily, if the decoded data stored in the register group are u0 and u1, then the first calculation sub-unit of the second decoding unit as shown in FIG. 2 can be switched to the first calculation sub-unit as shown in FIG. 3, so as to continue to calculate the decoded data u2 and u3. If the decoded data stored in the register group are u0 to u3, then the first and second calculation sub-units of the second decoding unit as shown in FIG. 3 can be switched to the first and second calculation sub-units as shown in FIG. 4, wherein the first calculation sub-unit as shown in FIG. 3 and the first calculation sub-unit as shown in FIG. 2 are actually the same calculation sub-unit with different input data.

Step 130: if the sum of the lengths of the decoded data is an integer multiple of an upper limit of the decoding times of the second decoding unit, updating the first decoding unit and the second decoding unit, if the sum of the lengths of the decoded data is not an integer multiple of the upper limit of the decoding times of the second decoding unit, updating the second decoding unit to obtain the decoded data again, until the sum of the lengths of the decoded data is equal to the decoding length, and merging the decoded data to serve as a decoding result of the original data.

It should be noted that, since the second decoding unit only outputs one decoded data at a time, after one decoded data is obtained, it is necessary to judge whether the complete decoding of the original data is completed, that is, whether the sum of the lengths of the currently obtained decoded data is equal to the decoding length, if the sum of the lengths of the currently obtained decoded data is less than the decoding length, subsequent decoded data are continuously calculated by updating the decoding resources, until the sum of the lengths of the decoded data is equal to the decoding length, and then, the current decoded data are merged to serve as the decoding result of the original data.

In an example, the step: if the sum of the lengths of the decoded data is an integer multiple of the upper limit of the decoding times of the second decoding unit, updating the first decoding unit and the second decoding unit, and if the sum of the lengths of the decoded data is not an integer multiple of the upper limit of the decoding times of the second decoding unit, updating the second decoding unit to obtain the decoded data again, until the sum of the lengths of the decoded data is equal to the decoding length, can include: if the sum of the lengths of the decoded data stored in the register group is an integer multiple of the upper limit of the decoding times of the second decoding unit, updating the first decoding unit and the second decoding unit, and if the sum of the lengths of the decoded data stored in the register group is not an integer multiple of the upper limit of the decoding times of the second decoding unit, updating the second decoding unit to obtain the decoded data again, until the sum of the lengths of the decoded data stored in the register group is equal to the decoding length.

The updating of the decoding unit actually refers to updating the calculation sub-units in the decoding unit.

In a specific implementation, if the upper limit of the decoding times of the second decoding unit is 32, the decoded data stored in the register group is u0, that is, the sum of the lengths of the decoded data is 1, then it is necessary to update the first calculation sub-unit in the second decoding unit according to u0, so as to obtain decoded data u1 according to the updated first calculation sub-unit, and after u1 is obtained, the sum of the lengths of the decoded data is 2, and then the second calculation sub-unit in the second decoding unit can be updated according to the decoded data u0 and u1; and if the decoded data stored in the register group are u0-u31, that is, the sum of the lengths of the decoded data is 32, then it is necessary to update the calculation sub-units in the first decoding unit and the second decoding unit according to the decoded data u0-u31, respectively.

According to the decoding method and device, the apparatus, and the storage medium provided by the embodiments of the present disclosure, by means of grouping the original data, decoding the grouped original data in parallel by the first decoding unit to obtain the grouped decoded data, then decoding the merged grouped decoded data by the second decoding unit to obtain the decoded data, before the sum of the lengths of the decoded data is equal to the decoding length, repeatedly updating the first decoding unit and the second decoding unit, or updating the second decoding unit to obtain new decoded data, and finally obtaining the decoding result of the original data, the reconstruction of decoding resources is realized while maintaining the time delay basically unchanged.

Figure 5:
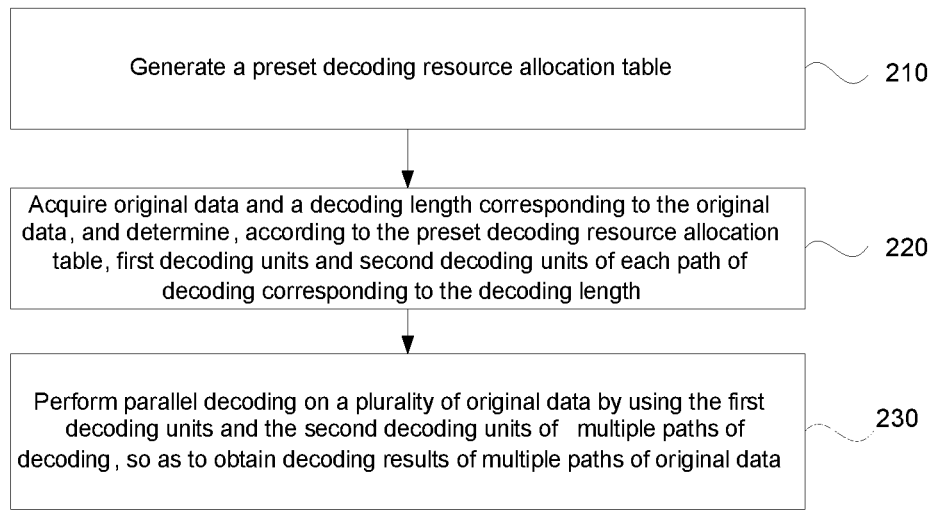
FIG. 5 is another schematic flow diagram of a decoding method according to an embodiment of the present disclosure.

FIG. 5 is another schematic flow diagram of a decoding method according to an embodiment of the present disclosure. The method can include:

Step 210: generating a preset decoding resource allocation table.

In an example, the method can include: presetting a preset number of decoding lengths; determining the number of parallel decoding paths corresponding to each decoding length; for each decoding length, selecting, from a fixed number of minimum decoding units, a first number of second decoding units and first coding units that respectively match the second decoding units; and generating the preset decoding resource allocation table according to serial numbers of the second decoding units corresponding to each decoding length and the serial numbers of the first coding units, wherein the first number is equal to the number of parallel decoding paths corresponding to the current decoding length.

It should be noted that, the preset number of decoding lengths can include 6 decoding lengths with a length of $2^n (n \in Z, 5 \le n \le 10)$. For limited decoding resources, that is, for the fixed number of minimum decoding units, the decoding resources required for decoding original data of each decoding length are different. Therefore, in order to improve the utilization rate of the decoding resources and the decoding efficiency, and to reduce the waste of the decoding resources, the limited decoding resources can be used for performing multiple paths of parallel decoding on the original data to be decoded.

Figure 6:
FIG. 6 is a schematic diagram of a decoding structure of a decoding length according to an embodiment of the present disclosure.
Figure 7:
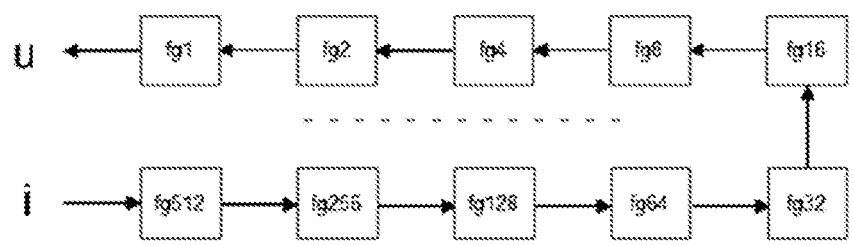
FIG. 7 is a schematic diagram of a decoding structure of another decoding length according to an embodiment of the present disclosure.
Figure 8:
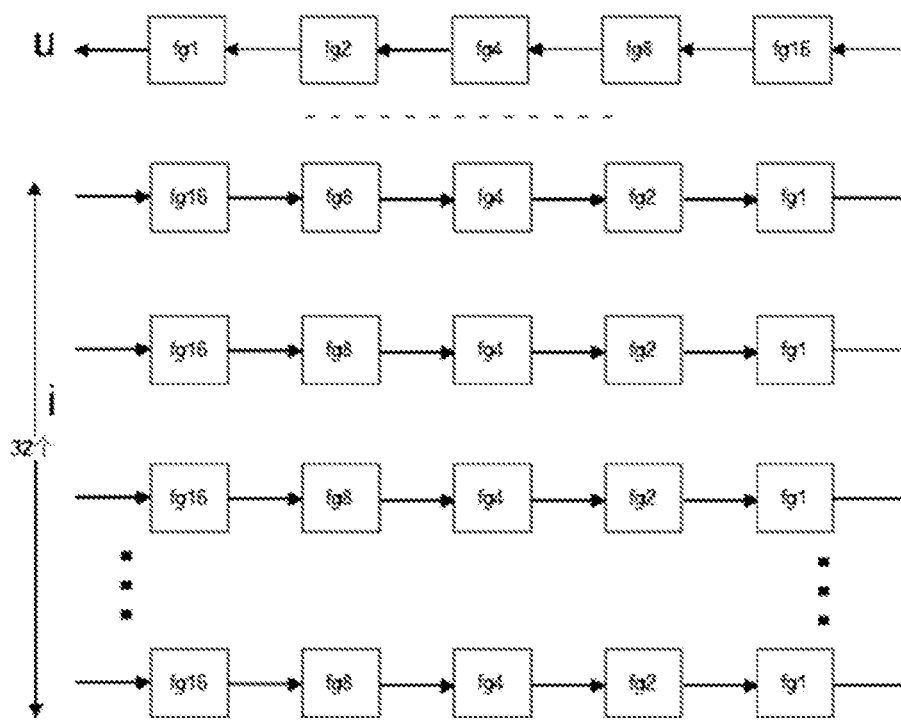
FIG. 8 is a decomposed schematic diagram of a decoding structure of another decoding length according to an embodiment of the present disclosure.
Figure 9:
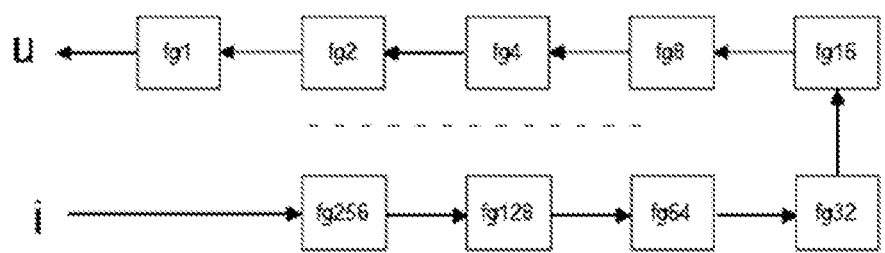
FIG. 9 is a schematic diagram of a decoding structure of yet another decoding length according to an embodiment of the present disclosure.
Figure 10:
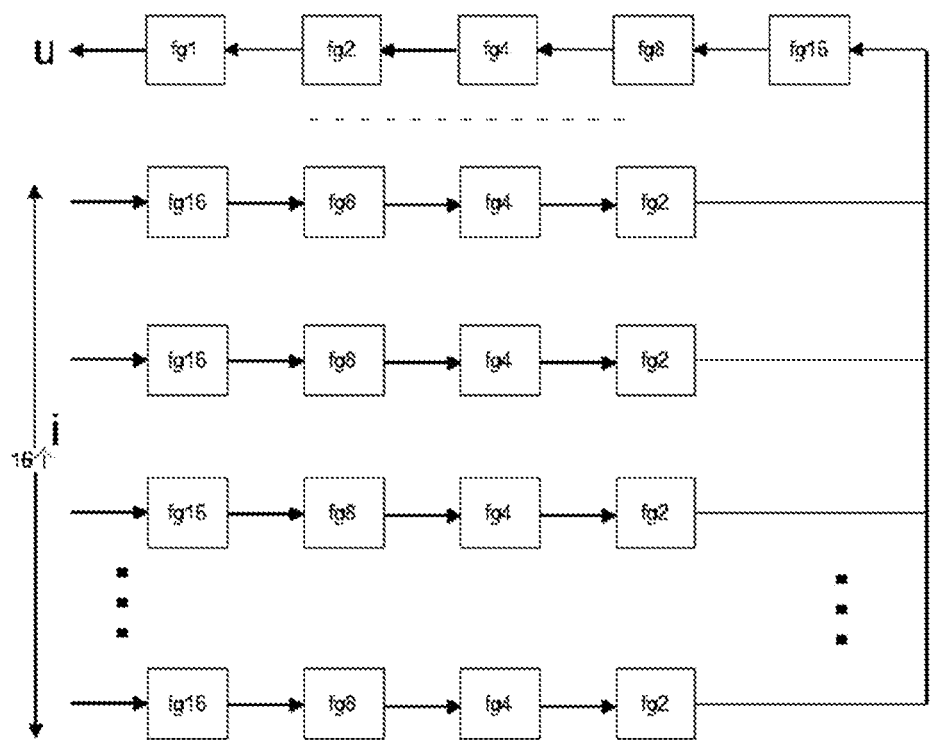
FIG. 10 is a decomposed schematic diagram of a decoding structure of yet another decoding length according to an embodiment of the present disclosure.

In a specific implementation, a decoding structure with the minimum decoding length can be used as the minimum decoding unit, and the decoding structures of other various decoding lengths can be realized by combining the minimum decoding units. FIG. 6 shows a decoding structure with a decoding length 32 according to an embodiment of the present disclosure, that is, the minimum decoding unit in the present embodiment; FIG. 7 shows another decoding structure with a decoding length 1024 according to an embodiment of the present disclosure, and by decomposing the decoding structure as shown in FIG. 8, it can be seen that the decoding structure with the decoding length 1024 is equivalent to 33 minimum decoding units; FIG. 9 shows yet another decoding structure with a decoding length 512 according to an embodiment of the present disclosure, and by decomposing the decoding structure as shown in FIG. 10, it can be seen that the decoding structure with the decoding length 512 is equivalent to a tapping result of one minimum decoding unit and 16 minimum decoding units; and so on, the decoding structures of various decoding lengths can be formed by the minimum decoding units, wherein the decoding structure represents a combination of decoding resources when the original data are decoded.

In a specific implementation, by decomposing the decoding structure, it can be seen that the number of the minimum decoding units corresponding to each decoding length is C=decoding length/32+1, that is, when the original data of various decoding lengths are decoded, the number C of the minimum decoding units is shown in Table 1:

TABLE 1

|  | Decoding length | | | | | |
| --- | --- | --- | --- | --- | --- | --- |
|  | 32 | 64 | 128 | 256 | 512 | 1024 |
| The number C of the minimum decoding units required | 1 | 3 | 5 | 9 | 17 | 33 |

As can be seen from Table 1, the decoding with the decoding length 1024 requires at least 33 minimum decoding units. If the total number of the minimum decoding units is 33, the decoding with the decoding length 512 will have idle decoding resources of 16 minimum decoding units, but in fact, two paths of 512 decoding parallel calculation can be realized by adding one minimum decoding unit, although this will correspondingly result in idle decoding resources of one minimum decoding unit in the decoding with the decoding length 1024, the utilization rate of the decoding resources is still greatly improved. Excessive increase in the minimum decoding units will lead to a complex interconnection relationship between the minimum decoding units and increase the processing time delay, therefore, according to experience, when the total number of the minimum decoding units is 33-40, the number of wasted minimum decoding units at each decoding length is calculated, and the results are shown in Table 2.

TABLE 2

|  |  | The total number of the minimum decoding units | | | | | | | |
| --- | --- | --- | --- | --- | --- | --- | --- | --- | --- |
|  |  | 33 | 34 | 35 | 36 | 37 | 38 | 39 | 40 |
| Decoding length | 64 | 0 | 1 | 2 | 0 | 1 | 2 | 0 | 1 |
|  | 128 | 3 | 4 | 0 | 1 | 2 | 3 | 4 | 0 |
|  | 256 | 6 | 7 | 8 | 0 | 1 | 2 | 3 | 4 |
|  | 512 | 16 | 0 | 1 | 2 | 3 | 4 | 5 | 6 |
|  | 1024 | 0 | 1 | 2 | 3 | 4 | 5 | 6 | 7 |

As can be seen from Table 2, when 36 minimum decoding units are selected to decode the original data of various decoding lengths, the waste of the decoding resources is the least. Therefore, 36 minimum decoding units are utilized in the present embodiment.

In an example, for each decoding length, the number of parallel decoding paths that can be supported by 36 minimum decoding units is determined in combination with Table 1, that is, a quotient of 36 and the number C of the minimum decoding units in Table 1, and then for each path of decoding, a second decoding unit and C−1 first decoding units are respectively selected from the 36 minimum decoding units; and then, the preset decoding resource allocation table is generated according to the serial numbers of the second decoding units corresponding to each decoding length and the serial numbers of the first coding units.

Step 220: acquiring original data and a decoding length corresponding to the original data, and determining, according to the preset decoding resource allocation table, the first decoding units and the second decoding units of each path of decoding corresponding to the decoding length.

It should be noted that, a plurality of original data that are independent of each other and have the same decoding length can be obtained at the same time. By querying the preset decoding resource allocation table, the number of parallel decoding paths corresponding to the decoding length can be determined, that is, the maximum number that supports the simultaneous decoding of the decoding length, as well as the first decoding units and the second decoding units of each path of decoding, so that a plurality of original data can be decoded at the same time, thereby making full use of the decoding resources, and improving the utilization rate of the decoding resources and the decoding efficiency.

Exemplarily, assuming that three original data with a decoding length 256 are acquired at the same time, and by querying the preset decoding resource allocation table, it is determined that the maximum number of parallel decoding paths corresponding to the decoding length 256 is 4, that is, at most 4 paths of decoding with the decoding length 256 are supported at the same time. Therefore, the acquired 3 original data can be decoded at the same time.

It should be noted that, the embodiment of the present disclosure only supports the multiple paths of parallel decoding with the same decoding length, and does not support the simultaneous parallel decoding of a plurality of original data with different decoding lengths.

Step 230: performing parallel decoding on a plurality of original data by using the first decoding units and the second decoding units of multiple paths of decoding, so as to obtain decoding results of multiple paths of original data.

It should be noted that, before performing the parallel decoding on the plurality of original data, it is necessary to averagely group the corresponding original data according to the number of the first decoding units in each path of decoding, so as to obtain multiple groups of original data matching the first decoding units. The specific grouping process of the original data in each path of decoding is substantially the same as the grouping process in step 110 as shown in FIG. 1, and thus will not be described in detail herein.

In an example, for a path of decoding, decoding grouped original data can include: decoding the grouped original data in parallel by the first decoding unit to obtain grouped decoded data, decoding merged grouped decoded data by the second decoding unit to obtain decoded data, if the sum of the lengths of the decoded data is an integer multiple of an upper limit of the decoding times of the second decoding unit, updating the first decoding unit and the second decoding unit, if the sum of the lengths of the decoded data is not an integer multiple of the upper limit of the decoding times of the second decoding unit, updating the second decoding unit to obtain the decoded data again, until the sum of the lengths of the decoded data is equal to the decoding length, and merging the decoded data to serve as the decoding result of the original data.

It should be noted that, the step 230 shown in FIG. 5 is substantially the same as the steps 110 to 130 in FIG. 1, and thus will not be repeated in the present embodiment.

In the embodiment of the present disclosure, by establishing the preset decoding resource allocation table in advance, after the decoding length corresponding to the original data is obtained, the preset decoding resource allocation table can be queried to determine the first decoding units and the second decoding units of each path of decoding corresponding to the decoding length, the existing decoding resources are reconstructed while the time delay is basically unchanged, therefore multiple paths of parallel decoding is realized, and the utilization rate of the decoding resources and the decoding efficiency are improved.

Figure 11:
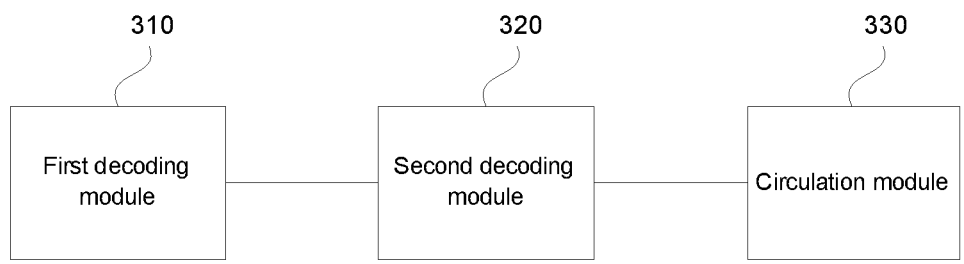
FIG. 11 is a schematic structural diagram of a decoding device according to an embodiment of the present disclosure.

FIG. 11 is a schematic structural diagram of a decoding device according to an embodiment of the present disclosure. As shown in FIG. 11, the device includes:
- a first decoding module 310, configured to decode grouped original data in parallel by a first decoding unit to obtain grouped decoded data;
- a second decoding module 320, configured to decode merged grouped decoded data by a second decoding unit to obtain decoded data; and
- a circulation module 330 configured to, if the sum of the lengths of the decoded data is an integer multiple of an upper limit of the decoding times of the second decoding unit, update the first decoding unit and the second decoding unit, if the sum of the lengths of the decoded data is not an integer multiple of the upper limit of the decoding times of the second decoding unit, update the second decoding unit to obtain the decoded data again, until the sum of the lengths of the decoded data is equal to a decoding length, and merge the decoded data to serve as a decoding result of the original data.

The decoding device provided by the present embodiment is configured to implement the decoding method of the present disclosure. The implementation principles and technical effects of the decoding device provided by the present embodiment are similar to those of the decoding method of the present disclosure, and thus will not be repeated herein.

In an example, the first decoding module 310 is further configured to: before decoding the grouped original data in parallel by the first decoding unit to obtain the grouped decoded data, acquire a decoding length corresponding to the original data; and determine, according to a preset decoding resource allocation table, a first decoding unit and a second decoding unit corresponding to the decoding length.

In an example, the device further includes: a table establishment module configured to: before determining, according to the preset decoding resource allocation table, the first decoding unit and the second decoding unit corresponding to the decoding length, preset a preset number of decoding lengths; determine the number of parallel decoding paths corresponding to each decoding length; for each decoding length, select, from a fixed number of minimum decoding units, a first number of second decoding units and first coding units that respectively match the second decoding units; and generate the preset decoding resource allocation table according to serial numbers of the second decoding units corresponding to each decoding length and the serial numbers of the first coding units, wherein the first number is equal to the number of parallel decoding paths corresponding to the current decoding length.

In an example, the device further includes: a grouping module configured to: before decoding the grouped original data in parallel by the first decoding unit to obtain the grouped decoded data, determine, according to the decoding length, a second number corresponding to each first decoding unit; and for each first decoding unit, sequentially extract a second number of original data to be decoded from the original data after every third number of original data to be decoded, and merge the extracted data to be decoded in sequence to serve as the grouped original data corresponding to the first decoding unit.

In an example, the second decoding module 320 is further configured to: after obtaining the decoded data, store the decoded data in a register group; and the circulation module 330 is specifically configured to: if the sum of the lengths of the decoded data stored in the register group is an integer multiple of the upper limit of the decoding times of the second decoding unit, update the first decoding unit and the second decoding unit, and if the sum of the lengths of the decoded data stored in the register group is not an integer multiple of the upper limit of the decoding times of the second decoding unit, update the second decoding unit to obtain the decoded data again, until the sum of the lengths of the decoded data stored in the register group is equal to the decoding length.

In an example, the device further includes: a switching module configured to: after storing the decoded data in the register group, if the sum of the lengths of the decoded data stored in the register group conforms to a preset calculation sub-unit switching rule, switch calculation sub-units in the first decoding unit or the second decoding unit.

In an example, the preset calculation sub-unit switching rule includes: switching the $M^{th}$ calculation sub-unit in the first decoding unit, when the sum of the lengths of the decoded data is an integer multiple of the number *2*M of the first decoding units; and switching the Nth calculation sub-unit in the second decoding unit, when the sum of the length of the decoded data is an integer multiple of 2*N, wherein the $M^{th}$ calculation sub-unit includes M basic calculators, and the Nth calculation sub-unit includes N basic calculators.

Figure 12:
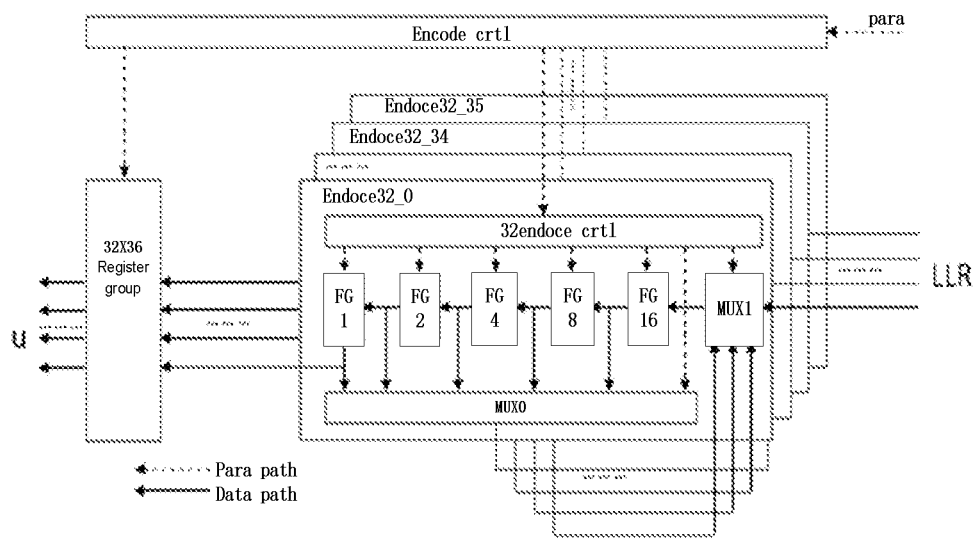
FIG. 12 is a schematic diagram of an internal structure of a decoding device according to an embodiment of the present disclosure.

FIG. 12 is a schematic diagram of an internal structure of a decoding device according to an embodiment of the present disclosure. The device internally includes:
- a task scheduling unit (encode ctrl) 1202 configured to: acquire a decoding length corresponding to original data, and obtain required parameters of each minimum decoding unit according to the decoding length;

minimum decoding units (encode32_x) 1204 configured to: independently complete a decoding process of a decoding length 32, wherein 36 minimum decoding units are provided in total. Each minimum decoding unit includes a set of processing core controllers, a set of calculation sub-units FG (a first calculation sub-unit FG1, a second calculation sub-unit FG2, a fourth calculation sub-unit FG4, an eighth calculation sub-unit FG8 and a sixteenth calculation sub-unit FG16), which is capable of independently completing the decoding process of the decoding length 32, and a set of input and output selection units. For the present device, the first to the $24^{th}$ minimum decoding units do not need input selection, and the $33^{rd}$ to the $36^{th}$ minimum decoding units do not need output selection;

a processing core controller (32encode Ctrl) 1206 configured to: control the updating enable of each calculation sub-unit FG and the selection enable of the input and output selection units according to parameters issued by a task scheduling module;

the $t^{th}$ calculation sub-unit FGt configured to: complete t complete FG calculations in parallel; and a register group 1208 configured to: store the decoded data u that has been calculated.

In a specific implementation, according to various decoding lengths, the overall workflow of the present device is as follows:

For the decoding length 1024:

1) encode32_0-31 are connected with encode32_32 in FIG. 12 to perform a path of decoding, wherein encode32_32 represents the second decoding unit, encode32_0-31 represent the first decoding units, and encode32_33-35 do not participate in the decoding.

2) According to the rule of extracting 1 piece of data after every 32 pieces of data, one original data (LLR) is divided into 32 groups, which are respectively used as input data of the first decoding units encode32_0-31.

3) The first calculation sub-unit FG1 of each first decoding unit outputs one grouped decoded data, and merges 32 grouped decoded data into a decoding input of the second decoding unit encode32_32. The second decoding unit obtains a decoded data (u value) during every decoding.

4) Every time when a decoded data is calculated, the decoded data is updated into the 32×36 register group, if the sum of the lengths of the decoded data stored in the register group is an integer multiple of 32, the states of the calculation sub-units FG in the first decoding unit and the second decoding unit are updated by using the decoded data in the register group, and if the sum of the lengths of the decoded data stored in the register group is not an integer multiple of 32, the states of the calculation sub-units FG in the second decoding unit are updated by using the decoded data in the register group, so as to calculate the next decoded data.

FG1, FG2, FG4, FG8 and FG16 in the second decoding unit are respectively switched every time when 2, 4, 8, 16 and 32 decoded data are decoded. FG1, FG2, FG4 and FG8 in the first decoding unit are respectively switched every time when 64, 128, 256 and 512 decoded data are decoded, and the state of FG16 is not switched.

5) After 1024 circulations are performed to update the values of the FG and the register group, the decoding of the decoding length 1024 is completed, and 1024 decoded data stored in the register group are output as the decoding result of the original data.

For the decoding length 512:

1) encode32_0-15 are connected with encode32_32 in FIG. 12 to perform a path of decoding, encode32_16-31 are connected with encode32_33 to perform a path of decoding, the two paths of decoding are performed in parallel, and encode32_34-35 do not participate in the decoding, wherein encode32_32-33 represent the second decoding units, and encode32_0-31 represent the first decoding units.

2) According to the rule of extracting 2 pieces of data after every 32 pieces of data, each of 2 irrelevant original data (LLR) is divided into 16 groups, which are respectively used as input data of the first decoding units encode32_0-15 and encode32_16-31.

3) The second calculation sub-unit FG2 of each first decoding unit outputs 2 grouped decoded data, and merges 16 groups of grouped decoded data of the encode32_0-15 into the decoding input of the second decoding unit encode32_32, wherein the encode32_32 obtains a decoded data (u value) during every decoding. The second calculation sub-unit FG2 merges 16 groups of grouped decoded data of the encode32_16-31 into the decoding input of the second decoding unit encode32_33, wherein the encode32_33 obtains a decoded data (u value) during every decoding.

4) Every time when a decoded data is calculated, the decoded data is updated into a corresponding portion of the 32×36 register group, if the sum of the lengths of the decoded data stored in the register group is an integer multiple of 32, the states of the calculation sub-units FG in the first decoding unit and the second decoding unit are updated by using the decoded data stored in the portion of the register group, and if the sum of the lengths of the decoded data stored in the register group is not an integer multiple of 32, the states of the calculation sub-units FG in the second decoding unit are updated by using the decoded data stored in the portion of the register group, so as to calculate the next decoded data, wherein the 32×36 register group is divided into two portions, which are respectively used for two paths of decoding calculation.

FG1, FG2, FG4, FG8 and FG16 in the second decoding unit are respectively switched every time when 2, 4, 8, 16 and 32 decoded data are decoded. FG2, FG4 and FG8 in the first decoding unit are respectively switched every time when 64, 128 and 256 decoded data are decoded, the state of FG16 is not switched, and FG1 is not used.

5) After 512 circulations are performed to update the values of the FG and the register group, the decoding of the decoding length 512 is completed, and two groups of decoded data stored in the register group are output as two paths of decoding results of the original data.

For the decoding length 256:

1) encode32_0-31 are connected with encode32_32-35 in FIG. 12 to perform 4 paths of decoding parallel processing, wherein encode32_32-35 represent the second decoding units, and encode32_0-31 represent the first decoding units.

2) According to the rule of extracting 4 pieces of data after every 32 pieces of data, each of 4 irrelevant original data (LLR) is divided into 8 groups, which are respectively used as input data of 4 paths of first decoding units encode32_0-7, encode32_8-15, encode32_16-23 and encode32_24-31.

3) The fourth calculation sub-unit FG4 of each first decoding unit outputs 4 grouped decoded data, and merges 8 groups of grouped decoded data of each path of decoding into the decoding input of the corresponding second decoding unit, wherein the second decoding unit obtains a decoded data (u value) during every decoding.

4) Every time when a decoded data is calculated, the decoded data is updated into a corresponding portion of the 32×36 register group, if the sum of the lengths of the decoded data stored in the register group is an integer multiple of 32, the states of the calculation sub-units FG in the first decoding unit and the second decoding unit are updated by using the decoded data stored in the portion of the register group, and if the sum of the lengths of the decoded data stored in the register group is not an integer multiple of 32, the states of the calculation sub-units FG in the second decoding unit are updated by using the decoded data stored in the portion of the register group, so as to calculate the next decoded data, wherein the 32×36 register group is divided into 4 portions, which are respectively used for 4 paths of decoding calculation.

FG1, FG2, FG4, FG8 and FG16 in the second decoding unit are respectively switched every time when 2, 4, 8, 16 and 32 decoded data are decoded. FG4 and FG8 in the first decoding unit are respectively switched every time when 64 and 128 decoded data are decoded, the state of FG16 is not switched, and FG1 and FG2 are not used.

5) After 256 circulations are performed to update the values of the FG and the register group, the decoding of the decoding length 256 is completed, and 4 groups of decoded data stored in the register group are output as 4 paths of decoding results of the original data.

For the decoding length 128:

1) encode32_0-27 are connected with encode32_28-35 (encode32_31 does not participate in the decoding) in FIG. 12 to perform 7 paths of decoding parallel processing, wherein encode32_28-35 represent the second decoding units, and encode32_0-27 represent the first decoding units.

2) According to the rule of extracting 8 pieces of data after every 32 pieces of data, each of 7 irrelevant original data (LLR) is divided into 4 groups, which are respectively used as input data of 7 paths of first decoding units.

3) The eighth calculation sub-unit FG8 of each first decoding unit outputs 8 grouped decoded data, and merges 4 groups of grouped decoded data of each path of decoding into the decoding input of the corresponding second decoding unit, wherein the second decoding unit obtains a decoded data (u value) during every decoding.

4) Every time when a decoded data is calculated, the decoded data is updated into a corresponding portion of the 32×36 register group, if the sum of the lengths of the decoded data stored in the register group is an integer multiple of 32, the states of the calculation sub-units FG in the first decoding unit and the second decoding unit are updated by using the decoded data stored in the portion of the register group, and if the sum of the lengths of the decoded data stored in the register group is not an integer multiple of 32, the states of the calculation sub-units FG in the second decoding unit are updated by using the decoded data stored in the portion of the register group, so as to calculate the next decoded data, wherein the 32×36 register group is divided into 7 portions, which are respectively used for 7 paths of decoding calculation.

FG1, FG2, FG4, FG8 and FG16 in the second decoding unit are respectively switched every time when 2, 4, 8, 16 and 32 decoded data are decoded. FG8 in the first decoding unit is switched every time when 64 decoded data are decoded, the state of FG16 is not switched, and FG1, FG2 and FG4 are not used.

5) After 128 circulations are performed to update the values of the FG and the register group, the decoding of the decoding length 128 is completed, and 7 groups of decoded data stored in the register group are output as 7 paths of decoding results of the original data.

For the decoding length 64:

1) encode32_0-23 are connected with encode32_24-35 in FIG. 12 to perform 12 paths of decoding parallel processing, wherein encode32_24-35 represent the second decoding units, and encode32_0-23 represent the first decoding units.

2) According to the rule of extracting 16 pieces of data after every 32 pieces of data, each of 12 irrelevant original data (LLR) is divided into 2 groups, which are respectively used as input data of 12 paths of first decoding units.

3) The sixteenth calculation sub-unit FG16 of each first decoding unit outputs 16 grouped decoded data, and merges 2 groups of grouped decoded data of each path of decoding into the decoding input of the corresponding second decoding unit, wherein the second decoding unit obtains a decoded data (u value) during every decoding.

4) Every time when a decoded data is calculated, the decoded data is updated into a corresponding portion of the 32×36 register group, if the sum of the lengths of the decoded data stored in the register group is an integer multiple of 32, the states of the calculation sub-units FG in the first decoding unit and the second decoding unit are updated by using the decoded data stored in the portion of the register group, and if the sum of the lengths of the decoded data stored in the register group is not an integer multiple of 32, the states of the calculation sub-units FG in the second decoding unit are updated by using the decoded data stored in the portion of the register group, so as to calculate the next decoded data, wherein the 32×36 register group is divided into 12 portions, which are respectively used for 12 paths of decoding calculation.

FG1, FG2, FG4, FG8 and FG16 in the second decoding unit are respectively switched every time when 2, 4, 8, 16 and 32 decoded data are decoded. FG8 in the first decoding unit is switched every time when 64 decoded data are decoded, the state of FG16 is not switched, and FG1, FG2 and FG4 are not used.

5) After 64 circulations are performed to update the values of the FG and the register group, the decoding of the decoding length 64 is completed, and 12 groups of decoded data stored in the register group are output as 12 paths of decoding results of the original data.

For the decoding length 32:

1) Each of encode32_0-35 in FIG. 12 is individually decoded to complete 36 paths of decoding processes.

2) 36 irrelevant original data (LLR) are respectively used as the input data of 36 paths of minimum decoding units encode32_0-35, and each second decoding unit obtains a decoded data (u value).

3) Every time when a decoded data is calculated, the decoded data is updated into a corresponding portion of the 32×36 register group, and meanwhile, the states of the calculation sub-units FG in the corresponding minimum decoding unit are updated by using the decoded data stored in the portion of the register group, so as to calculate the next decoded data, wherein the 32×36 register group is divided into 36 portions, which are respectively used for 36 paths of decoding calculation.

FG1, FG2, FG4, FG8 and FG16 in the minimum decoding unit are respectively switched every time when 2, 4, 8 and 16 decoded data are decoded, and the state of FG16 is not switched.

4) After 32 circulations are performed to update the values of the FG and the register group, the decoding of the decoding length 32 is completed, and 36 groups of decoded data stored in the register group are output as 36 paths of decoding results of the original data.

In the embodiment of the present disclosure, decoding units with other decoding lengths can be constructed by using the minimum decoding units with the decoding length 32, the configuration process is simple, and the circuit structure is easy to implement. For different performance requirements, construction can be performed just by increasing the number of the minimum decoding units. For a single-path decoding processing process, the time delay in the embodiment of the present disclosure remains basically unchanged, but multiple paths of decoding processes can be performed in parallel by using the existing decoding resources, thereby greatly improving the decoding efficiency and the resource utilization rate, and improving the economic benefits.

Figure 13:
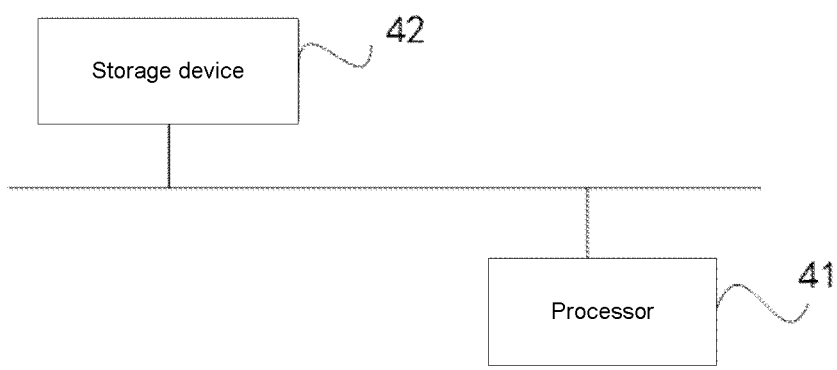
FIG. 13 is a schematic structural diagram of a network device provided by an embodiment of the present disclosure.

FIG. 13 is a schematic structural diagram of a network device provided by an embodiment of the present disclosure. The device provided by the embodiment of the present disclosure includes: one or more processors 41 and a storage device 42; the processor 41 of the device can be one or more, and one processor 41 is taken as an example in FIG. 13; the storage device 42 is configured to store one or more programs; and the one or more programs are executed by the one or more processors 41, so that the one or more processors 41 implement the decoding method in the embodiment of the present disclosure.

The processor 41 and the storage device 42 in the device can be connected by a bus or in other ways, and the connection by a bus is taken as an example in FIG. 13.

As a computer-readable storage medium, the storage device 42 can be configured to store software programs, computer-executable programs and modules, such as program instructions/modules corresponding to the decoding method in the embodiment of the present disclosure. The storage device 42 can include a program storage area and a data storage area, wherein the program storage area can store an operating system, and an disclosure program required by at least one function; and the data storage area can store data created according to the use of the device, etc. In addition, the storage device 42 can include high-speed random access memory, and can also include a non-volatile memory, such as at least one magnetic disk storage device, a flash memory device, or other non-volatile solid state storage devices. In some instances, the storage device 42 optionally includes memories that are remotely disposed relative to the processor 41, and these remote memories can be connected to the device by means of a network. Instances of the network include, but are not limited to, the Internet, an intranet, a local area network, a mobile communication network and combinations thereof.

The embodiment of the present disclosure provides a storage medium, on which a computer program is stored, and when executed by a processor, the program implements any decoding method in the embodiments of the present disclosure.

The decoding method includes: decoding grouped original data in parallel by a first decoding unit to obtain grouped decoded data; decoding merged grouped decoded data by a second decoding unit to obtain decoded data; and if the sum of the lengths of the decoded data is an integer multiple of an upper limit of the decoding times of the second decoding unit, updating the first decoding unit and the second decoding unit, and if the sum of the lengths of the decoded data is not an integer multiple of the upper limit of the decoding times of the second decoding unit, updating the second decoding unit to obtain the decoded data again, until the sum of the lengths of the decoded data is equal to a decoding length, and merging the decoded data to serve as a decoding result of the original data.

The above descriptions are merely exemplary embodiments of the present disclosure, and are not intended to limit the protection scope of the present disclosure.

In general, a variety of embodiments of the present disclosure can be implemented in hardware or dedicated circuits, software, logic, or any combination thereof. For example, some aspects can be implemented in hardware, while other aspects can be implemented in firmware or software that can be executed by a controller, a microprocessor or other computing apparatuses, although the embodiments of the present disclosure are not limited thereto.

The embodiments of the present disclosure can be implemented by a data processor of a mobile device by means of executing computer program instructions, for example, in a processor entity, or by hardware, or by a combination of software and hardware. The computer program instructions can be assembly instructions, instruction set architecture (Instruction Set Architecture, ISA) instructions, machine instructions, machine related instructions, microcodes, firmware instructions, state setting data, or source codes or target codes that are written in any combination of one or more programming languages.

The block diagram of any logic flow in the drawings of the embodiments of the present disclosure can represent program steps, or can represent interconnected logic circuits, modules and functions, or can represent a combination of program steps and logic circuits, modules and functions. The computer program can be stored on the memory. The memory can be of any type suitable for the local technical environment and can be implemented by using any suitable data storage technology, for example, but not limited to, a read-only memory (Read-Only Memory, ROM), a random access memory (Random Access Memory, RAM), and an optical memory device and system (a digital video disc (Digital Video Disc (DVD) or a compact disk (Compact Disk, CD)), etc. The computer-readable medium can include a non-transitory storage medium. The data processor can be of any type suitable for the local technical environment, for example, but not limited to, a general-purpose computer, a special-purpose computer, a microprocessor, a digital signal processor (Digital Signal Processing, DSP), an disclosure specific integrated circuit (Disclosure Specific Integrated Circuit, ASIC), a field-programmable gate array (Field-Programmable Gate Array, FGPA), and a processor based on a multi-core processor architecture.

The detailed description of the exemplary embodiments of the present disclosure has been provided above by way of illustrative and non-limiting examples. However, considering the drawings and claims, various modifications and adjustments to the above embodiments will be obvious to those skilled in the art, but do not deviate from the scope of the embodiments of the present disclosure. Accordingly, the proper scope of the present disclosure will be determined with reference to the claims.

INDUSTRIAL APPLICABILITY

By means of grouping the original data, decoding the grouped original data in parallel by the first decoding unit to obtain the grouped decoded data, then decoding the merged grouped decoded data by the second decoding unit to obtain the decoded data, before the sum of the lengths of the decoded data is equal to the decoding length, repeatedly updating the first decoding unit and the second decoding unit, or updating the second decoding unit to obtain new decoded data, and finally obtaining the decoding result of the original data, the problems of a relatively long decoding length, and an obvious increase in the decoding time delay and the occupied resources are solved. The reconstruction of decoding resources is realized while maintaining the time delay basically unchanged.

What is claimed is:

1. A decoding method, performed by a decoding device of a wireless communication system, the decoding device including a task scheduling unit, multiple minimum decoding units and a register, the multiple minimum decoding units including a first decoding unit and a second decoding unit, each minimum decoding unit including a set of processing core controllers, a set of calculation sub-units which is capable of independently completing the decoding process, and a set of input and output selection units, the decoding method comprising:
   decoding grouped original data in parallel by the first decoding unit to obtain grouped decoded data;
   decoding merged grouped decoded data by the second decoding unit to obtain decoded data; and
   if the sum of the lengths of the decoded data is an integer multiple of a maximum number of decoding iteration of the second decoding unit, updating the first decoding unit and the second decoding unit, and if the sum of the lengths of the decoded data is not an integer multiple of the maximum number of decoding iteration of the second decoding unit, updating the second decoding unit to obtain the decoded data again, until the sum of the lengths of the decoded data is equal to a decoding length, and merging the decoded data to serve as a decoding result of the original data; wherein the register is configured to store the decoded data.

2. The method according to claim 1, wherein before decoding the grouped original data in parallel by the first decoding unit to obtain the grouped decoded data, the method further comprises:
   acquiring a decoding length corresponding to the original data; and
   determining, according to a preset decoding resource allocation table, the first decoding unit and the second decoding unit corresponding to the decoding length.

3. The method according to claim 2, wherein before determining, according to the preset decoding resource allocation table, the first decoding unit and the second decoding unit corresponding to the decoding length, the method further comprises:
   presetting a preset number of decoding lengths;
   determining the number of parallel decoding paths corresponding to each decoding length;
   for each decoding length, selecting, from a fixed number of minimum decoding units, a first number of second decoding units and first coding units that respectively match the second decoding units; and
   generating the preset decoding resource allocation table according to serial numbers of the second decoding units corresponding to each decoding length and the serial numbers of the first coding units,
   wherein the first number is equal to the number of parallel decoding paths corresponding to the current decoding length.

4. An apparatus, comprising:
   one or more processors; and
   a storage apparatus, configured to store one or more programs, wherein when the one or more programs are executed by the one or more processors, the one or more processors are configured to implement the decoding method according to claim 3.

5. A non-transitory storage medium, wherein a computer program is stored in the storage medium, and when executed by a processor, the computer program is configured to implement the decoding method according to claim 3.

6. An apparatus, comprising:
   one or more processors; and
   a storage apparatus, configured to store one or more programs, wherein when the one or more programs are executed by the one or more processors, the one or more processors are configured to implement the decoding method according to claim 2.

7. A non-transitory storage medium, wherein a computer program is stored in the storage medium, and when executed by a processor, the computer program is configured to implement the decoding method according to claim 2.

8. The method according to claim 1, wherein before decoding the grouped original data in parallel by the first decoding unit to obtain the grouped decoded data, the method further comprises:
   determining, according to the decoding length, a second number corresponding to each first decoding unit; and
   for each first decoding unit, sequentially extracting a second number of original data to be decoded from the original data after every third number of original data to be decoded, and merging the extracted original data to be decoded in sequence to serve as the grouped original data corresponding to the first decoding unit.

9. An apparatus, comprising:
   one or more processors; and
   a storage apparatus, configured to store one or more programs, wherein when the one or more programs are executed by the one or more processors, the one or more processors are configured to implement the decoding method according to claim 8.

10. A non-transitory storage medium, wherein a computer program is stored in the storage medium, and when executed by a processor, the computer program is configured to implement the decoding method according to claim 8.

11. The method according to claim 1, wherein, after obtaining the decoded data, the method further comprises:
    storing the decoded data in a register group; and
    the step: if the sum of the lengths of the decoded data is an integer multiple of the maximum number of decoding iteration of the second decoding unit, updating the first decoding unit and the second decoding unit, and if the sum of the lengths of the decoded data is not an integer multiple of the maximum number of decoding iteration of the second decoding unit, updating the second decoding unit to obtain the decoded data again, until the sum of the lengths of the decoded data is equal to the decoding length, comprises:
    if the sum of the lengths of the decoded data stored in the register group is an integer multiple of the upper limit of the decoding times of the second decoding unit, updating the first decoding unit and the second decoding unit, and if the sum of the lengths of the decoded data stored in the register group is not an integer multiple of the upper limit of the decoding times of the second decoding unit, updating the second decoding unit to obtain the decoded data again, until the sum of the lengths of the decoded data stored in the register group is equal to the decoding length.

12. The method according to claim 11, wherein after storing the decoded data in the register group, the method further comprises:
    if the sum of the lengths of the decoded data stored in the register group conforms to a preset calculation sub-unit switching rule, switching calculation sub-units in the first decoding unit or the second decoding unit.

13. The method according to claim 12, wherein the preset calculation sub-unit switching rule comprises:
  switching the Mth calculation sub-unit in the first decoding unit, when the sum of the lengths of the decoded data is an integer multiple of the number *2*M of the first decoding units; and
  switching the Nth calculation sub-unit in the second decoding unit, when the sum of the length of the decoded data is an integer multiple of 2*N,
  wherein the Mth calculation sub-unit comprises M calculators, and the Nth calculation sub-unit comprises N calculators.

14. An apparatus, comprising:
  one or more processors; and
  a storage apparatus, configured to store one or more programs, wherein when the one or more programs are executed by the one or more processors, the one or more processors are configured to implement the decoding method according to claim 13.

15. An apparatus, comprising:
  one or more processors; and
  a storage apparatus, configured to store one or more programs, wherein when the one or more programs are executed by the one or more processors, the one or more processors are configured to implement the decoding method according to claim 11.

16. An apparatus, comprising:
  one or more processors; and
  a storage apparatus, configured to store one or more programs, wherein when the one or more programs are executed by the one or more processors, the one or more processors are configured to implement the decoding method according to claim 12.

17. An apparatus, comprising:
  one or more processors; and
  a storage apparatus, configured to store one or more programs, wherein when the one or more programs are executed by the one or more processors, the one or more processors are configured to implement the decoding method according to claim 1.

18. A non-transitory storage medium, wherein a computer program is stored in the storage medium, and when executed by a processor, the computer program is configured to implement the decoding method according to claim 1.

19. A decoding device, located in a network device of a wireless communication system, the decoding device including a task scheduling unit, multiple minimum decoding units and a register, the multiple minimum decoding units including a first decoding unit and a second decoding unit, each minimum decoding unit including a set of processing core controllers, a set of calculation sub-units which is capable of independently completing the decoding process, and a set of input and output selection units, the decoding device comprising:
  a first decoding module, configured to decode grouped original data in parallel by a the first decoding unit to obtain grouped decoded data;
  a second decoding module, configured to decode merged grouped decoded data by a the second decoding unit to obtain decoded data; and
  a circulation module configured to, if the sum of the lengths of the decoded data is an integer multiple of a maximum number of decoding iteration of the second decoding unit, update the first decoding unit and the second decoding unit, if the sum of the lengths of the decoded data is not an integer multiple of the maximum number of decoding iteration of the second decoding unit, update the second decoding unit to obtain the decoded data again, until the sum of the lengths of the decoded data is equal to a decoding length, and merge the decoded data to serve as a decoding result of the original data; wherein the register is configured to store the decoded data.

* * * * *